United States Patent [19]

Lipman

[11] 4,266,190
[45] May 5, 1981

[54] DUAL CORE MAGNETIC AMPLIFIER SENSOR

[75] Inventor: Kenneth Lipman, West Hartford, Conn.

[73] Assignee: United Technologies Corporation, Hartford, Conn.

[21] Appl. No.: 970,766

[22] Filed: Dec. 18, 1978

[51] Int. Cl.³ .......................... G01R 33/00; H03F 9/00
[52] U.S. Cl. ..................................... 324/117 R; 330/8
[58] Field of Search ................... 324/117 R, 253, 127; 330/8

[56] References Cited

U.S. PATENT DOCUMENTS

| 2,657,281 | 10/1953 | Kluz | 330/8 |
| 2,892,155 | 6/1959 | Radus et al. | 324/117 R |
| 3,135,911 | 6/1964 | Van Allen | 324/117 R |
| 3,351,851 | 11/1967 | Darling | 330/8 |
| 3,855,528 | 12/1974 | Brown | 324/117 R |

OTHER PUBLICATIONS

"Tape Wound Core Design Manual"; Magnetic Metals, Co., Camden, N.J.; (no date); pp. 1, 54–56.

*Primary Examiner*—Ernest F. Karlsen
*Attorney, Agent, or Firm*—Richard P. Lange

[57] ABSTRACT

A magnetic amplifier sensor for measuring the magnitude and polarity of a DC current flowing in a line includes a pair of saturable cores, each having a primary and secondary winding mounted thereon. The primary coils are connected in series and a portion of the DC current component to be measured is diverted to a shunt circuit which includes the primary windings. The secondary coils are connected to a push/pull type of AC source so that the flux levels in the cores operate in a drive/reset mode. A DC current in the primary winding causes a variation in the absolute magnitude of the flux levels of the two cores as a function of the time constant of the shunt circuit so that during the drive interval one core saturates before the other. After rectifying, a differential signal is formed which when integrated provides an output signal whose magnitude is indicative of the magnitude DC component of current in the shunt circuit and where polarity is indicative of the polarity of the DC component of current in the shunt circuit. A second embodiment of a magnetic amplifier sensor includes an additional winding on each of the saturable cores. A portion of the output signal is fed back to the two additional windings, which are connected in series, to provide the negative feedback for improving overall input-to-output linearity, and also for enhancing the response time of the amplifier sensor.

5 Claims, 5 Drawing Figures

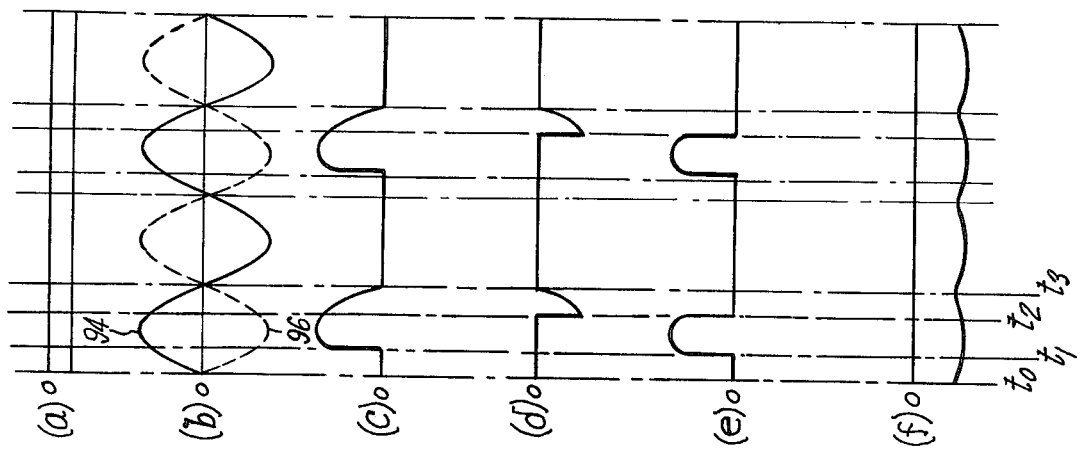
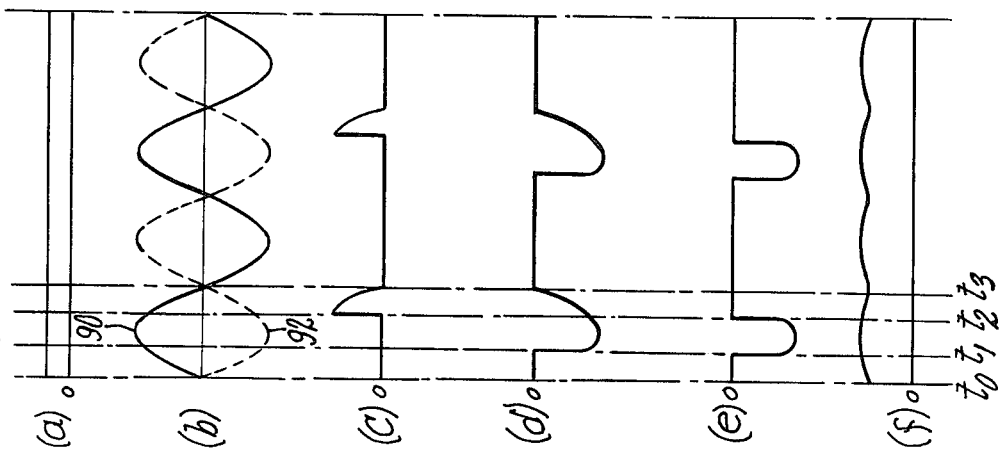
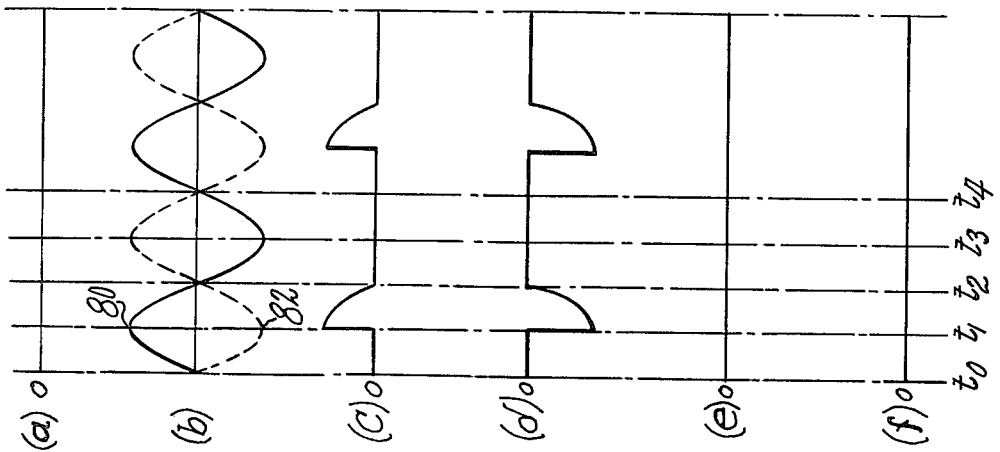

DUAL CORE MAGNETIC AMPLIFIER SENSOR

BACKGROUND OF THE INVENTION

1. Field of the Invention

This invention relates to current measuring devices and, more particularly to a circuit for measuring the magnitude and polarity of a DC current flowing in a line.

2. Description of the Prior Art

Many different types of devices for measuring DC electric current are known and one such device is a magnetic amplifier which is typically used where the DC current being measured is at a high voltage level making it desirable to electrically isolate the measuring instruments from the potentially dangerous effects of the high voltage. Magnetic amplifier sensors typically utilize a plurality of saturable reactors, which may include a saturable core on which the conductor is wound that carries the DC current to be measured. These saturable reactors may influence the bias voltage from a source of AC source by an amount proportional to the measured current. Finally, an indicating device, such as a meter or the like, provides a readable indicia of the measured DC current.

One such device, disclosed in U.S. Pat. No. 3,855,528 issued to H. Brown on Dec. 17, 1974 entitled DC CURRENT MEASURING CIRCUIT, is a measuring circuit for indicating the magnitude of DC current flow through a conductor which includes a voltage generating circuit for creating chopped DC voltages and a magnetic amplifier with two saturable cores. The current to be measured is passed through the command winding to control the current which the voltage generating circuit applies to the control winding. The measuring circuit exhibits a plurality of equilibrium conditions in each of which the magnitude of the control current flow is determined by the magnitude of the input current, thus causing the control current flow to be a continuous DC output indication of DC input current.

A related measuring device is disclosed in U.S. Pat. No. 3,135,911 issued June 2, 1964 to R. Van Allen entitled POLARITY SENSITIVE SATURABLE CORE REACTOR. This measuring circuitry includes a saturable reactor having two cores, and a polarity sensing circuit inductively coupled to the saturable reactor to produce a unidirectional signal responsive to the direction of the measured current which is in turn used as a control winding of the saturable reactor.

Still another similar apparatus is disclosed in U.S. Pat. No. 2,892,155 issued June 23, 1959 to R. Radas et al entitled APPARATUS RESPONSIVE TO DIRECT QUANTITIES. The Radas et al device is concerned with correcting the non-linear condition that occurs within the range of relatively small values of measured current so that for a zero value of the energizing quantity, there is produced an output quantity having a zero value. A transformer essentially acts as a bias winding and one coil links the cores of the magnetic amplifier. The bias winding is effective when energized to render the cores responsive to the polarity of the energizing quantity to thereby render the measuring instrument responsive to both the magnitude and direction of the energy quantity.

Of interest is a discussion of high-speed reset magnetic amplifiers on page 54 of "Tape Wound Core Design Manual" issued by Magnetic Metals Company of Camden, New Jersey (no date). A self-saturating type of magnetic amplifier is disclosed in which AC power causes the magnetic core to saturate and a rectified waveform appears across a load. The AC voltage resets the cores flux level every half cycle so that there is a new flux level from which the gate circuit will start on the next cycle. A differential output type for high stability type operation to actuate hydraulic valves or other differentially operating devices.

The prior art magnetic amplifier type of current sensing device which provides both a magnetic and polarity indication at the output typically required three or more coils on a saturable core or, if only two coils on each core were used, an elaborate bias adjustment circuit is needed to compensate for variations in temperature and AC source voltage driving the cores that would otherwise distort the output linearity.

SUMMARY OF THE INVENTION

It is an object of the present invention to provide a magnetic amplifier sensor for measuring the magnitude and polarity of a high voltage DC current with a saturable core technique employing a minimal number of coils.

Another object of the present invention is to provide a DC current measuring device with a minimal number of component parts which is suitable for measuring high voltage DC electric current and providing an output signal indicating the magnitude and polarity of the measured current in an environment which may be subject to temperature and voltage variations.

According to the present invention, a magnetic amplifier sensor includes a pair of saturable cores, each having a pair of coils disposed thereon. One of the windings on each of the saturable cores is connected in series and receives at least a portion of the current of which the DC level is to be measured. The other windings on each core are driven differentially by an AC source creating drive voltages that drive the cores into saturation during the first half of the sinusoidal cycle of the AC supply voltage and reset the flux level during the last half cycle. In the absence of a DC current to be measured in the series-connected cores, the two cores are balanced to saturate at approximately the same phase angle so that the drive voltage differentially cancels. However, in the presence of a DC current the drive voltages form a voltage signal whose polarity is indicative of the measured current and whose integral is proportional to the magnitude of the measured current.

According to a second embodiment of the present invention, a magnetic amplifier sensor includes a pair of saturable cores, each having a third winding mounted thereon, this being in addition to the primary and secondary windings. The primary windings on each of the saturable cores are connected in series and receive at least a portion of the current of which the DC level is to be measured. The third winding is mounted on each of the saturable cores to create a magnetomotive force in opposition to that produced by the DC current in the shunt circuit. The secondary windings on each core are driven differentially by an AC source creating drive voltages that force the cores into saturation during the first half of the sinusoidal cycle of the AC supply voltage and reset the flux level in the cores during the last half cycle. A portion of the output signal is present to the series-connected third windings on each core to provide negative feedback which improves the overall input-to-output linearity of the magnetic amplifier by allowing operation along a smaller segment of the well known BH curve. The negative feedback also enhances the response time of the magnetic amplifier sensor.

Other objects, features and advantages of the present invention will become apparent in light of the following detailed description of a preferred embodiment as illustrated in the accompanying drawing.

BRIEF DESCRIPTION OF THE DRAWINGS

FIG. 2 is a graphic illustration of the circuit waveforms versus time at various locations in the embodiment of the magnetic amplifier sensor shown in FIG. 1, these conditions occurring when there is no current in the shunt circuit;

FIG. 3 is a graphic illustration of various circuit waveforms versus time at various locations in the embodiment of the magnetic amplifier sensor of FIG. 1, these conditions occurring when there is current flowing through the shunt circuit in the first direction;

FIG. 4 is a graphic illustration of circuit waveforms versus time at various locations in the embodiment of the magnetic amplifier illustrated in FIG. 1, these conditions occurring when there is current flowing in the shunt circuit in the reverse direction.

DETAILED DESCRIPTION OF THE ILLUSTRATED EMBODIMENTS

Figure 1:
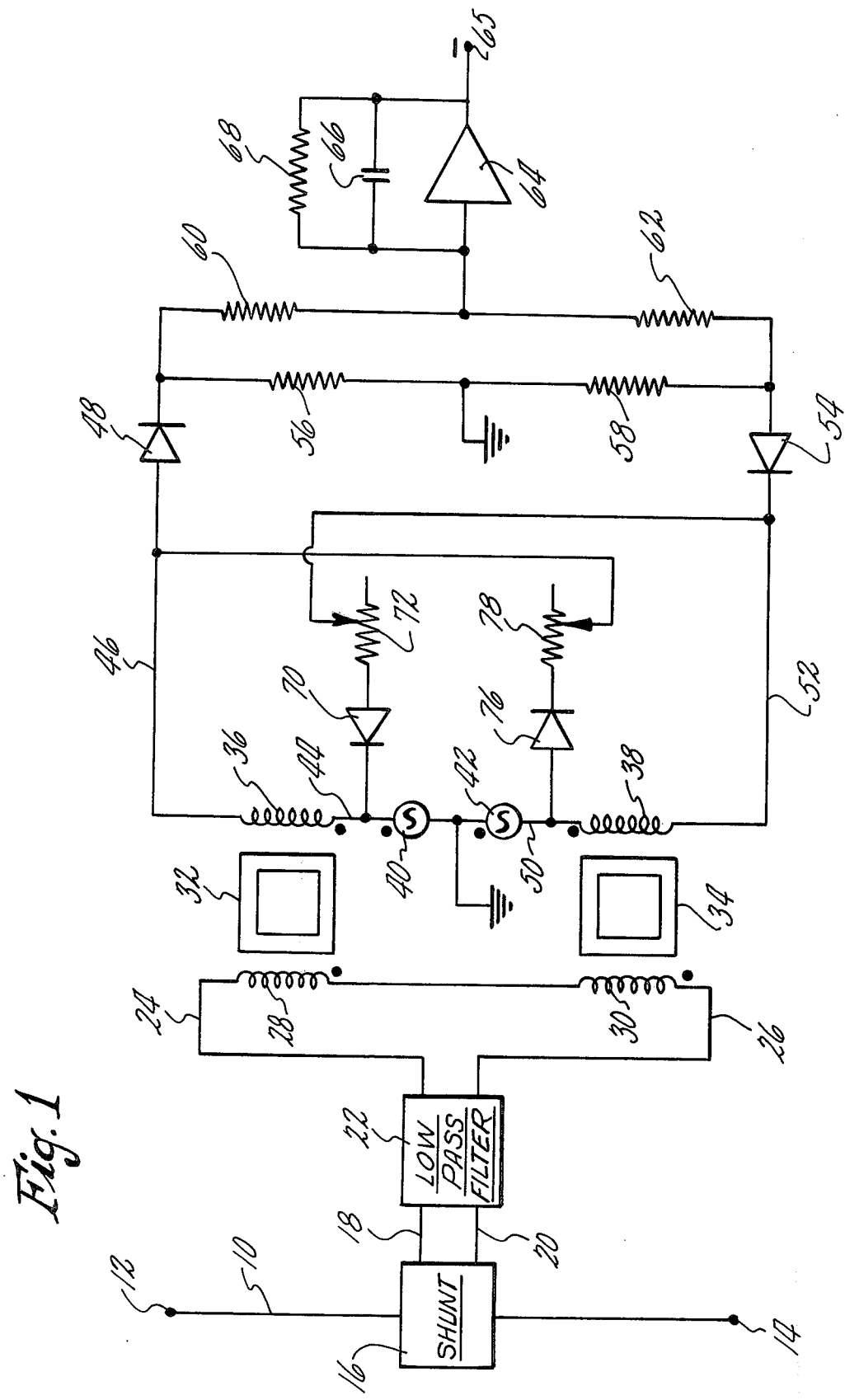
FIG. 1 is a schematic block diagram illustration of one embodiment of a magnetic amplifier sensor according to the present invention.

Referring initially to FIG. 1, there is seen a first embodiment of a magnetic amplifier sensor according to the present invention which is used to measure the magnitude and direction of a DC current flowing in a line 10 from a terminal 12 to a terminal 14. The line 10 may carry output electrical energy from a device such as a converter (not shown) or other types of machine to an electrical power-consuming or producing device (not shown) and this electrical energy may be at a voltage level of up to several thousand volts with a current level of from zero to hundreds or even thousands of amperes. One type of converter is an inverter which converts DC electrical energy to AC electrical energy but the output from an inverter typically includes both a DC current component and an AC current component and it is often necessary to precisely measure the DC current component in order to control the inverter itself.

To this end, a conventional shunt 16 is connected in line 10 in a series relationship such that all of the current between terminals 12 and 14 passes therethrough. The shunt 16 includes a pair of secondary terminals to which lines 18 and 20 are connected and a small amount of current is diverted from line 10 through this shunt circuit, this diverted current being of a known proportional relationship to the current in the line 10.

A low pass filter 22 is connected in the shunt circuit in the lines 18 and 20 for removing any AC component of the current diverted from the current in the line 10. The DC component of the shunted current is fed from the low pass filter 22, via the lines 24 and 26, to a pair of series-connected primary windings 28 and 30. A first saturable core 32 and a second saturable core 34 are provided and the windings 28 and 30 are mounted on the first and second saturable cores, respectively. It is important to note the directional orientation of each of the windings 28 and 30 on the respective cores (indicated by the dots in FIG. 1) in that the proportional DC current diverted from the line 10 into the shunt circuit creates a magnetomotive force or flux field in the core in one direction, (e.g. clockwise in the drawing), in response to a DC current flowing in a first direction in the line 10 from the terminal 12 to the terminal 14. However, a flux field is created in the opposite direction (e.g. counterclockwise in FIG. 1) in each core in response to a DC current flowing in an opposite direction in the line 10 from the terminal 14 to the terminal 12. Also mounted on the core 32 and the core 34 are secondary windings 36 and 38, respectively. The primary winding 28 on the first saturable core 32 is wound in a differential relationship with the secondary winding 36 so that a current in one direction (i.e. into the dots) establishes flux fields that oppose each other. However, the primary winding 30 and the secondary winding 38 positioned on the second saturable core 34 are wound in such a manner that a current therethrough in one direction (i.e. into the dots) creates respective flux fields which reinforce or add. The conductors making up each of the windings are insulated to provide electrical isolation between the individual coils of each winding and also between the primary and secondary windings themselves. Electrical isolation is particularly important between the primary and secondary windings on each saturable core because the output current of an inverter may be at a voltage potential in the kilovolt range while the circuit components that include the secondary windings are designed to operate at very low voltages and would be severely damaged if subjected to the high primary voltage potentials.

The magnetic amplifier sensor of the present invention includes an AC source such as a transformer with its center tap grounded so that it appears as an out-of phase pair of AC sources 40 and 42, connected in series with the innerconnection grounded. The frequency of operation of the AC sources 40 and 42 is selected to be sufficiently high such that during one cycle of operation for which the set and reset period of the saturable cores occurs, the magnitude of the DC level to be measured is relatively constant. The AC source 40 is connected via a line 44 to the secondary winding 36 on the first saturable core 32 and, in turn, by a line 46 to the anode side of a diode 48. In a similar manner, the AC source 42 is connected by a line 50 to the secondary winding 38 on the second saturable core 34 and, via a line 52, to the cathode side of a diode 54. A resistor 56 is connected between the cathode side of the diode 48 and ground while a resistor 58 is connected between the anode side of the diode 54 and ground. The differential voltage across the two resistors 56 and 58 is fed via a pair of resistors 60 and 62 to an integration circuit comprised of a high gain operational amplifier 64 with its input end connected to the resistors 60 and 62. A capacitor 66 and a resistor 68 shunt the input and the output terminal 65 of the amplifier 64 to create an integration circuit.

The magnetic amplifier sensor of the present invention includes a bias circuit for initially calibrating the component parts whose conducting state may vary slightly in response to temperature, shock or other such variations. The bias circuit includes a diode 70 which has its cathode terminal coupled to the line 44 between the AC source 40 and the secondary winding 36 on the first saturable core 32. A potentiometer 72 is connected between the anode terminal of the diode 70 and the line 52. This half of the circuit also functions to provide the reset current for the core 34. In a similar manner, the other half of the circuit comprises a diode 74 having its anode terminal coupled to the line 50 which connects the voltage source 42 to the secondary winding 38 on the second saturable core 34. A potentiometer 78 connects the cathode end of the diode 76 to the line 46. This half of the circuit also functions to provide reset current for the core 32. The bias circuit allows the two cores to be operated with flux level settings along the middle portion of the BH curve which is the most linear portion of the curve. Any drift in this initial calibration, such as would result from temperature variations, etc. affect both cores equally such tha the differential operation of the magnet amplifier results in no effect at the output.

To calibrate the magnetic amplifier sensor of the present invention, the shunt 16 diverting current from the line 10 is opened so that no current flows through the primary windings 28 and 30 on the saturable cores. An oscilloscope is connected across one winding and the respective potentiometer balance varied until saturation occurs at approximately 90°. With the other core balance to this point, the output voltage will be zero.

The operation of the dual core magnetic amplifier sensor according to the present invention will now be described. The magnetic amplifier sensor is of the reset type which has the advantage of overcoming the typically slow response inherent in a self-saturating device employing magnetic cores. The reset type of magnetic amplifier generally includes a first interval known as the drive interval when the cores are driven toward saturation and a second period known as the reset interval when the level of flux in the magnetic cores is driven back or reset to a lower point on the well known BH curve. Referring now to FIG. 2, illustration (a) represents the magnitude of the DC current diverted into the shunt circuit so that it passes through the primary windings 28 and 30. As is seen, the magnitude of the DC current is essentially zero so that there is no flux level within either the first saturable core 32 or the second saturable core 34 resulting from a DC current in these primary windings. Next, referring to illustration (b) of FIG. 2, a representation of the source voltage is seen and the voltage output of the AC source 40 is illustrated by waveform 80 while the voltage output of the AC source 42 is illustrated by waveform 82. The drive interval of the magnetic amplifier sensor occurs from $t_1$ to $t_2$ or during a first half cycle of the source voltage while the reset interval occurs during the last half cycle or from $t_2$ to $t_4$. When no DC component of the current is passed through the primary windings, (FIG. 1) both cores saturate essentially simultaneously during the drive period at $t_1$. Because there is no longer a flux change within each core, the voltage across the secondary windings drops to zero and the source voltages appear at the output end of the diodes. At this point $t_1$, the differential voltage from the sources 40 and 42 is impressed across the resistors 56 and 58 (the voltage waveform across the resistor 56 being shown in illustration (c) of FIG. 2 while the voltage waveform across the resistor 58 being shown in illustration (d) of FIG. 2) but because of the differential nature of the voltage, i.e. one is at a positive maximum while the other is at a negative maximum, the voltage waveforms cancel and the combined waveform is zero as seen in illustration (e) of FIG. 2. This voltage is presented to the input of the operational amplifier which acts as an integration circuit and no waveform appears at the output of the magnetic amplifier sensor, terminal 65. At $t_2$, the reset interval begins and the respective voltage sources cause a reverse current to flow in the secondary winding and the resulting current drives or resets the flux level in each of the saturable cores 32 and 34 from their respective maximum points on the well known BH magnetic curve so that by $t_4$ the cores are ready for the next drive interval. Accordingly, there is no output from the magnetic amplifier at terminal 62 as is seen in illustration (f) of FIG. 2.

Referring next to FIG. 3, the operation of the magnetic amplifier circuit according to the present invention will now be described when there is a DC component of current diverted from the line 10 into the shunt current so that it passes in series through the primary windings 28 and 30, the current level in the shunt circuit being shown in illustration (a) of FIG. 3. As before, illustration (b) of FIG. 3 is a representation of the source voltage waveform and the voltage output of the AC source 40 is represented by the waveform 90 while the voltage output of the AC source 42 is shown by the waveform 92. During the drive interval, $t_0$ to $t_3$, the AC sources 40 and 42 drive the flux levels in the respective cores toward their saturation point. But because of the absolute value of the flux level in the two cores is not identical due to the shunt current, the core 34 saturates first, as is seen in illustration (d) of FIG. 3 at $t_1$, causing voltage from the source 42 to then appear across the resistor 58. Because the flux level is still increasing in the saturable core 32, no matching voltage appears across the resistor 56 at this time, as is seen in illustration (c) of FIG. 3. Finally, the flux level in the core 32 reaches its saturation point, illustration (c) of FIG. 3 at $t_2$, and voltage from the AC source 40 now appears across the resistor 56. Accordingly, the combined differential voltage across the two resistors 56 and 58 is presented to the input of the integration amplifier, as shown in illustration (e) of FIG. 3. As will be appreciated by those or ordinary skill, the integration of this waveform will result in a signal at the output terminal 65 whose magnitude is directly proportional to the difference in saturation times of the two cores, or $t_1$ to $t_2$, while having a polarity in one direction, this being shown in illustration (f) of FIG. 3. It can be noted that there is a slight ripple on the output waveform which varies in magnitude with the selection of the circuit components as is well known.

Referring next to FIG. 4, the operation of the magnetic amplifier circuit according to the present invention will now be described when there is a DC component of current diverted from the line 10 into the shunt current so that it passes in series through the primary windings 28 and 30 in a reverse direction with respect to the illustrations of FIG. 3. In the same manner as before, the current level in the shunt circuit is shown in illustration (a) of FIG. 4 while a waveform 94 in illustration (b) of FIG. 4 is from the AC source 40, and the waveform 96 is from the AC source 42, shown as the waveform 96. During the drive interval, $t_0$ to $t_3$, the sources 40 and 42 drive the flux levels in the respective cores toward their saturation point. But because of the absolute value of the flux levels in the cores is not identical due to the shunt current, the core 32 saturates first, as is seen in illustration (d) of FIG. 3 at $t_1$, causing the voltage of the source to appear across the resistor 56. Because the flux level is still increasing in the saturable core 34, no corresponding voltage appears across the resistor 58 at this time $t_1$, as is seen in illustration (d) of FIG. 3. Finally, the flux level in the core 34 reaches its saturation point, illustration (d) in FIG. 3 at $t_2$, and the voltage of the source 42 appears across the resistor 58. Accordingly, during this period the combined differential voltage across the two resistors 56 and 58 presented to the input of the integration amplifier is as shown in illustration (e) of FIG. 3. As will be appreciated by a comparison of the output waveform, illustration (f) of FIG. 4, the integration of this waveform will result in a signal whose magnitude is directly proportional to the difference in the saturation times between the two cores, or $t_1$ to $t_2$, while having a polarity in a direction opposite to that shown in illustration (f) of FIG. 3.

Figure 5:
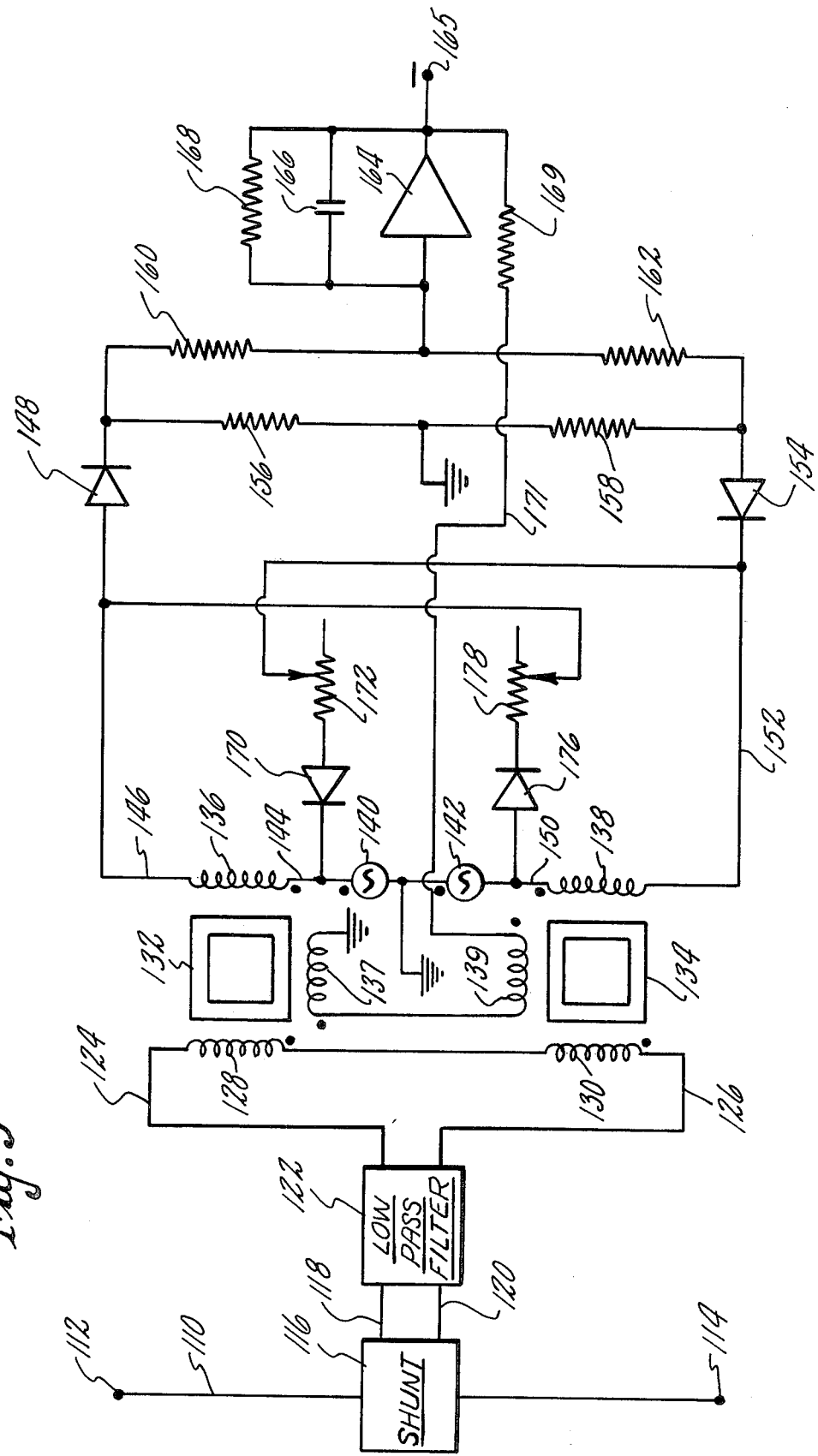
FIG. 5 is a schematic block diagram illustration of a second embodiment of a magnetic amplifier sensor according to the present invention.

Referring now to FIG. 5, there is seen a second embodiment of the magnetic amplifier sensor according to the present invention, this embodiment being well suited to measure both AC and DC currents due to its use of negative feedback. A conventional shunt 116 is connected in a line 110 in a series relationship such that all of the current passing between terminals 112 and 114 pass therethrough. The shunt 116 includes a pair of secondary terminals to which lines 118 and 120 are connected and a small amount of current is diverted from the line 110 through this shunt path, this diverted current being of a known proportional relationship to the current in the line 110. A low pass filter 122 is connected in the shunt circuit in lines 118 and 120 for removing any AC component of the current diverted from the larger current in the line 110. However, the low pass filter 122 can be smaller than the filter used in conjunction with the embodiment of FIG. 1 which increases response time, as will be described in greater detail hereinafter.

The shunted current is fed from the low pass filter 122 via lines 124 and 126 to a pair of series-connected primary windings 128 and 130. A first saturable core 132 and a second saturable core 134 are provided and the windings 128 and 130 are mounted on the first and second saturable cores, respectively. It is important to note the directional orientation of each of the windings 128 and 130 on the respective cores (indicated by the dots in FIG. 5) in that the proportional current diverted from the line 110 into the shunt circuit creates a magnetomotive force or flux field in the core in one direction (e.g. clockwise in the drawing), in response to a current flowing in the line 110 from the terminal 112 to the terminal 114. However, a flux field is created in the opposite direction (e.g. counterclockwise in FIG. 5) in each core in response to a current flowing in the line 110 from the terminal 114 to the terminal 112. Also mounted on the core 132 and the core 134 are secondary windings 136 and 138, respectively.

In this second embodiment of a magnetic amplifier sensor according to the present invention, a third winding 137 is mounted on the core 132 and a third winding 139 is mounted on the core 134, both third windings providing negative feedback. Each of these third windings are wound on their respective cores so that they establish a flux field that opposes that created in the core by the primary windings. In other words, a current through the primary winding 128 and through the third winding 137 in one direction (i.e. into the dots) establishes flux fields that oppose each other, the same being true for the primary winding 130 and the third winding 139 on the core 134. As before, the primary winding 128 on the first saturable core is wound in a differential relationship with the secondary winding 136 while the primary winding 130 and the secondary winding 138 are wound in such a manner that a current therethrough creates flux fields which reinforce or add. The conductors making up all three windings on each core are insulated to provide electrical isolation between each winding and also between the individual coils of the windings themselves. Electrical isolation is important because the current in the line 110 may be at a voltage potential in the kilovolt range or even higher if an AC device is involved while the circuit components that include the secondary and tertiary windings are designed to operate at very low voltages and would be severely damaged if subjected to the high primary voltage potentials.

As before, the magnetic amplifier sensor of the present invention includes an AC source with its center tap grounded so that it appears as an out-of-phase pair of AC sources 140 and 142 connected in series with the innerconnection grounded. The frequency of operation of the AC sources 140 and 142 is selected to be sufficiently high such that during one cycle of operation for which the set and reset period of the saturable cores occur, the magnitude of the level of current to be measured can be considered relatively constant, this being true even if the magnitude of an AC current is being measured because of rapid response time of this circuit configuration. The AC source 140 is connected, via a line 144, to the secondary winding 136 on the first saturable core 132 and, in turn by a line 146, to the anode side of a diode 148. In a similar manner, the AC source 142 is connected by a line 150 to the secondary winding 138 on the second saturable core 134 and, via a line 152, to the cathode side of a diode 154. A resistor 156 is connected between the cathode side of the diode 148 and ground while a resistor 158 is connected between the anode side of the diode 154 and ground. The differential voltage across the two resistors 156 and 158 is fed via resistors 160 and 162 to an integration circuit comprised of a high gain operational amplifier 164 coupled with its input connected to the resistors 160 and 162. A capacitor 166 and a resistor 168 shunt the input and output terminals of the amplifier 164 creating an integration circuit.

A feedback circuit of this second embodiment of the magnetic amplifier sensor includes a resistor 169 coupled to the output terminal 165 of the operational amplifier 164 for feeding back a portion of the output signal. A line 171 is connected to one side of the third winding 139 on the core 134. The other end of the third winding 139 is connected to one side of the winding 137 on the core 132. The other side of the winding 137 is connected to ground.

As before, a calibration circuit is provided for initially balancing the two halves of the circuit to compensate for any component parts whose conducting states may have varied slightly in response to temperature, shock or other such stresses. An additional advantage of this second embodiment is that due to the negative feedback provided through the tertiary windings, the calibration of the magnetic amplifier sensor is less critical. The calibration circuit incudes a diode 170 which has its cathode terminal coupled to the line 144 between the AC source 140 and the secondary winding 136 on the first saturable core 132. A potentiometer 172 is connected between the anode terminal of the diode 170 and the line 152. In a similar manner, the other half of the circuit comprises a diode 174 having its anode terminal coupled to the line 150 which connects the voltage source 142 to the secondary winding 138 on the second saturable core 134. A potentiometer 178 connects the cathode end of the diode 176 to the line 146.

To calibrate the magnetic amplifier sensor, the shunt circuit diverting current from the line 110 is open so that no current flows through either of the primary windings on the saturable cores 132 and 134. Without a flux induced in the saturable cores, the potentiometers 172 and 178 can be adjusted until the output voltage at the terminal 165 is balanced to zero.

The operation of this second embodiment of the dual core magnetic amplifier sensor according to the present invention can be best understood by referring to the heretofore described operation of the first embodiment. The written description of the operation of the first embodiment together with waveform illustrations in FIGS. 2-4 are equally applicable to this second embodiment. The feedback circuit presents a portion of the output signal appearing at the output terminal 165 through resistor 169 to the series-connected third windings on the saturable cores 132 and 134 which causes each of the saturable cores to operate on a shorter, and hence more linear, portion of the well known BH curve. Resistor 169 is usually chosen to be large enough to insure that the feedback current will be proportional to the voltage at terminal 165. As is known, negative feedback increases the response time of a circuit configuration at the expense of low circuit gain making this second embodiment particularly well suited for measuring the magnitude and polarity of a current which varies over a relatively short period of time, such as an AC current. Accordingly, this second embodiment can operate as an isolated measuring instrument for sensing either an AC or DC current in satisfying the environmental constraints of a number of measuring and testing requirements. Of course, the specific value of the circuit components shown in either the first or second embodiment would vary depending on the desired response times, current levels to be measured, etc. and the retention of these values would be within the skill of an artisan.

Although the invention has been shown and described with respect to a preferred embodiment thereof, it should be understood by those skilled in the art that various changes and omissions in the form and detail thereof may be made without departing from the spirit and scope of the invention.

Having thus described typical embodiments of our invention, that which we claim as new and desire to secure by Letters Patent of the United States is:

1. A magnetic amplifier for sensing the magnitude and polarity of a main current, comprising:

means including a pair of saturable cores, the flux level of which is drivable from an unsaturated state to a saturated state in response to a magnetomotive force in one direction and resettable from the saturated state to an unsaturated state by a magnetomotive force in the opposite direction;

shunt means responsive to said main current for generating a shunt current proportional to said main current to create a magnetomotive force which changes the flux level in each of said saturable cores in one direction;

voltage means for creating a drive magnetomotive force and a reset magnetomotive force within each of said pair of saturable cores for driving the respective flux levels of each core in opposite directions to a saturation point, and for resetting the respective flux levels within each of said saturable cores to a lower level;

bias means connected to said voltage means for initially calibrating the respective flux levels in each of said cores; and output means for sensing which one of said pair of saturable cores is first to saturate, and for sensing the time separating the saturation points of said saturable cores, and for providing an output signal which has a polarity indicative of the polarity of said main current and a magnitude proportional to said main current.

2. A magnetic amplifier according to claim 1, wherein said shunt means is connected to receive said main current therethrough, diverts a portion of said main current into a shunt circuit, and wherein a primary winding disposed on each of said pairs of saturable cores receives said shunt current therethrough.

3. A magnetic amplifier according to claim 2, further including a secondary winding disposed on each of said saturable core means, and wherein said voltage means is connected to each of said secondary windings for creating a drive magnetomotive force and a reset magnetomotive force with each saturable core, and wherein said output means further includes a diode means connected to each of said secondary windings for providing a differential voltage proportional to the deviation between the saturation points in each core.

4. A magnetic amplifier sensor according to claim 1, further including an integration means connected to said diode means for integrating the differential voltage thereacross to provide an output signal which is proportional to the main current.

5. A magnetic amplifier for sensing the magnitude and polarity of a main current, comprising:

means including a pair of saturable cores, the flux level of which is drivable from an unsaturated state to a saturated state in response to a magnetomotive force in one direction and resettable from the saturation state to an unsaturated state by a magnetomotive force in the opposite direction;

means including a primary winding and a secondary winding operatively associated with each of said pairs of saturable cores for creating a magnetomotive force therein;

shunt means connected to each of said primary windings for generating a shunt current proportional to said main current to change the flux level in each of said pair of saturable cores in one direction;

differential voltage means connected to said secondary winding on each of said pair of saturable cores for creating a drive magnetomotive force and a reset magnetomotive force within said pair of saturable cores for driving the respective flux levels of each core in opposite directions to a saturation point, and for resetting the respective flux levels within said saturable cores to a lower level;

bias means connected to said differential voltage means for initially calibrating the respective flux levels in each of said cores; and output means for sensing which one of said pair of saturable cores is first to saturate, and for sensing the time separation the saturation points of said saturable cores, and for providing an output signal which has a polarity indicative of the polarity of said main current and also has a magnitude proportional to said main current.

* * * * *